US008645875B2

(12) United States Patent
Cranmer et al.

(10) Patent No.: US 8,645,875 B2
(45) Date of Patent: Feb. 4, 2014

(54) METHOD FOR QUANTIFYING THE MANUFACTURING COMPLEXITY OF ELECTRICAL DESIGNS

(75) Inventors: Michael S. Cranmer, Poughkeepsie, NY (US); Richard P. Surprenant, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 492 days.

(21) Appl. No.: 12/914,367

(22) Filed: Oct. 28, 2010

(65) Prior Publication Data

US 2011/0038525 A1 Feb. 17, 2011

Related U.S. Application Data

(62) Division of application No. 11/969,495, filed on Jan. 4, 2008, now Pat. No. 7,873,936.

(51) Int. Cl.
*G06F 17/50* (2006.01)
*G06K 9/00* (2006.01)

(52) U.S. Cl.
USPC .......... 716/50; 716/51; 716/52; 716/53; 716/54; 716/55; 716/56; 382/145; 382/148; 382/149

(58) Field of Classification Search
USPC .......... 716/50–56; 382/145, 148, 149
See application file for complete search history.

(56) References Cited

U.S. PATENT DOCUMENTS

| | | | |
|---|---|---|---|
| 4,791,586 A | 12/1988 | Maeda et al. | |
| 4,996,434 A | 2/1991 | Tanaka et al. | |
| 5,481,138 A | 1/1996 | Economikos et al. | |
| 5,521,033 A | 5/1996 | Okamoto | |
| 5,539,652 A | 7/1996 | Tegethoff | |
| 5,883,437 A | 3/1999 | Maruyama et al. | |
| 6,509,956 B2 * | 1/2003 | Kobayashi | 355/55 |
| 6,553,546 B1 | 4/2003 | Murakami | |
| 6,603,875 B1 * | 8/2003 | Matsuyama et al. | 382/145 |
| 6,645,685 B2 | 11/2003 | Takata et al. | |
| 6,677,088 B2 * | 1/2004 | Magome et al. | 430/5 |
| 6,799,130 B2 | 9/2004 | Okabe et al. | |
| 6,886,153 B1 | 4/2005 | Bevis | |
| 7,017,141 B2 | 3/2006 | Anderson et al. | |
| 7,043,071 B2 | 5/2006 | Qian et al. | |
| 7,664,608 B2 * | 2/2010 | Urano et al. | 702/40 |
| 7,749,666 B2 * | 7/2010 | Gassner et al. | 430/30 |
| 7,752,594 B2 * | 7/2010 | Takeda et al. | 716/51 |
| 7,805,691 B2 * | 9/2010 | Majima et al. | 716/112 |
| 8,090,190 B2 * | 1/2012 | Nakagaki et al. | 382/148 |
| 8,275,189 B2 * | 9/2012 | Ueno et al. | 382/149 |
| 2002/0083398 A1 | 6/2002 | Takeyama et al. | |

(Continued)

*Primary Examiner* — Helen Rossoshek
(74) *Attorney, Agent, or Firm* — Scully, Scott, Murphy & Presser, P.C.; Ian D. MacKinnon, Esq.

(57) ABSTRACT

A method and system for quantifying manufacturing complexity of electrical designs randomly places simulated defects on image data representing electrical wiring design. The number of distinct features in the image data without the simulated defects and the number of distinct features in the image data with the simulated defects are determined and the differences between the two obtained. The difference number is used as an indication of shorting potential or probability that shorts in the wiring may occur in the electrical wiring design. The simulating of the defects in the image data may be repeated and the difference value from each simulation or run may be used to obtain a statistical average or representative shorting potential or probability for the design.

4 Claims, 4 Drawing Sheets

(56) References Cited

U.S. PATENT DOCUMENTS

| | | |
|---|---|---|
| 2003/0093763 A1 | 5/2003 | McConaghy |
| 2004/0247172 A1 | 12/2004 | Mitsui |
| 2004/0250232 A1 | 12/2004 | Kobozeva et al. |
| 2005/0188338 A1 | 8/2005 | Kroyan et al. |
| 2006/0005154 A1 | 1/2006 | Cobb et al. |
| 2006/0036977 A1 | 2/2006 | Cohn et al. |
| 2006/0053403 A1 | 3/2006 | Cowan et al. |
| 2006/0253810 A1 | 11/2006 | Guardiani et al. |
| 2007/0050736 A1 | 3/2007 | Bickford et al. |
| 2007/0087274 A1 | 4/2007 | Kukita et al. |
| 2007/0174797 A1 | 7/2007 | Luo et al. |
| 2007/0233419 A1 | 10/2007 | Pack et al. |
| 2007/0269738 A1 | 11/2007 | Itagaki et al. |
| 2008/0079931 A1 | 4/2008 | Lim et al. |
| 2010/0131909 A1* | 5/2010 | Miloslavsky et al. ............ 716/5 |
| 2010/0182602 A1* | 7/2010 | Urano et al. .................. 356/369 |

* cited by examiner

METHOD FOR QUANTIFYING THE MANUFACTURING COMPLEXITY OF ELECTRICAL DESIGNS

RELATED APPLICATIONS

This application is a divisional of U.S. Patent No. 7,873, 936, issued Jan. 18, 2011, the entire contents of which are incorporated herein by reference.

FIELD OF THE INVENTION

The present application relates to manufacture and design of electrical packages, and more particularly to quantifying the manufacturing complexity of electrical designs.

BACKGROUND OF THE INVENTION

Design activities related to electrical packages typically focus on the specifics of the required circuitry performance. A great deal of effort is placed on meeting resistance, impedance, and time of flight criteria for each network in the package. Many modeling techniques exist to provide designers with the optimal wiring layout to meet these requirements At the same time, a limited set of "ground rules" typically exists to ensure that the design can be manufactured. Ground rules provide design boundaries beyond which an impact to manufacturing may be experienced. In actuality, variations in design criteria below and approaching this ground rule boundary may have a variable level of impact.

Few modeling capabilities exist to quantify this variability. A model that could provide manufacturability feedback to designers could lead to improved yields, reduced cost and increased capacity, for example, in constrained manufacturing facilities or whole industry segments. Further, a model of this nature could allow these manufacturing lines to prioritize tooling utilization based on design complexity. For example, it could be determined to use newer and/or better tooling for more difficult designs and run easier designs on older and/or less efficient tooling.

BRIEF SUMMARY OF THE INVENTION

A method and system for quantifying manufacturing complexity of electrical designs are provided. The method in one aspect may include randomly generating a plurality of defect images on image data representing an electrical wiring design to form a composite image data and determining difference in the number of distinct features in the image data and the composite image data. The difference indicates shorting potential in the electrical wiring design. In another aspect, the steps of generating and determining may be repeated until one or more predetermined criteria is met and a representative shorting potential of the electrical wiring design may be determined based on a plurality of shorting potentials obtained from repeating the steps.

Yet in another aspect, a method of quantifying manufacturing complexity of electrical designs may include obtaining an image data representing an electrical circuit wiring design. The electrical circuit wiring design includes a plurality of distinctly countable design features. The method may also include determining a total number of said design features in the image data, and generating defects image data representing a plurality of defects associated with said electrical circuit wiring design. The method may further include combining the image data and the defects image data into a composite image, and removing from the composite image, one or more defects that do not touch a design feature in the composite image. The method may also include determining a total number of features in the composite image, subtracting the total number of features in the composite image from the total number of said design feature in the image data to determine shorting potential quantification. The method may further include repeating the steps of generating defects image data, combining the image data and the defects image data, removing, determining a total number of features in the composite image and subtracting until one or more predetermined criteria is met, and determining a statistical average of said shorting potential quantification.

A system for quantifying manufacturing complexity of electrical designs, in one aspect, may include a defects image generator module operable to run on a processor and to generate defects image data and combine the defects image data randomly with image data representing electrical wiring design to simulate a plurality of defects associated with the electrical wiring design. An image analysis module is operable to run on a processor and to determine difference in the number of distinct features in the image data representing electrical wiring design and the combined defects image data and the image data. The difference value represents quantification of shorting potential for the electrical wiring design.

A program storage device readable by a machine, tangibly embodying a program of instructions executable by the machine to perform the above-described methods of quantifying manufacturing complexity of electrical designs may be also provided.

Further features as well as the structure and operation of various embodiments are described in detail below with reference to the accompanying drawings. In the drawings, like reference numbers indicate identical or functionally similar elements.

DETAILED DESCRIPTION

A method in the present disclosure in one embodiment utilizes image analysis techniques to simulate the effect of randomly placed "defect" on a design. The randomly placed defects can simulate the shorting of the designed wiring features, for instance, if the defect were to be conductive. This method enables quantification, for example, the generation of a single number or result representing a shorting potential for the design layer being investigated. This number can then be directly compared to the results from layers of other products or to the results of a design change on the same layer, for instance, to optimize manufacturability of a project still in the design phase. The resulting number can represent a consistent basis on which comparisons can be made. Since the designs of wiring layers are inherently different, the technique provides a means of quantifying the impact defect distributions will have on the design layers—indicating which ones are more sensitive or robust in terms of manufacturability.

Figure 1:
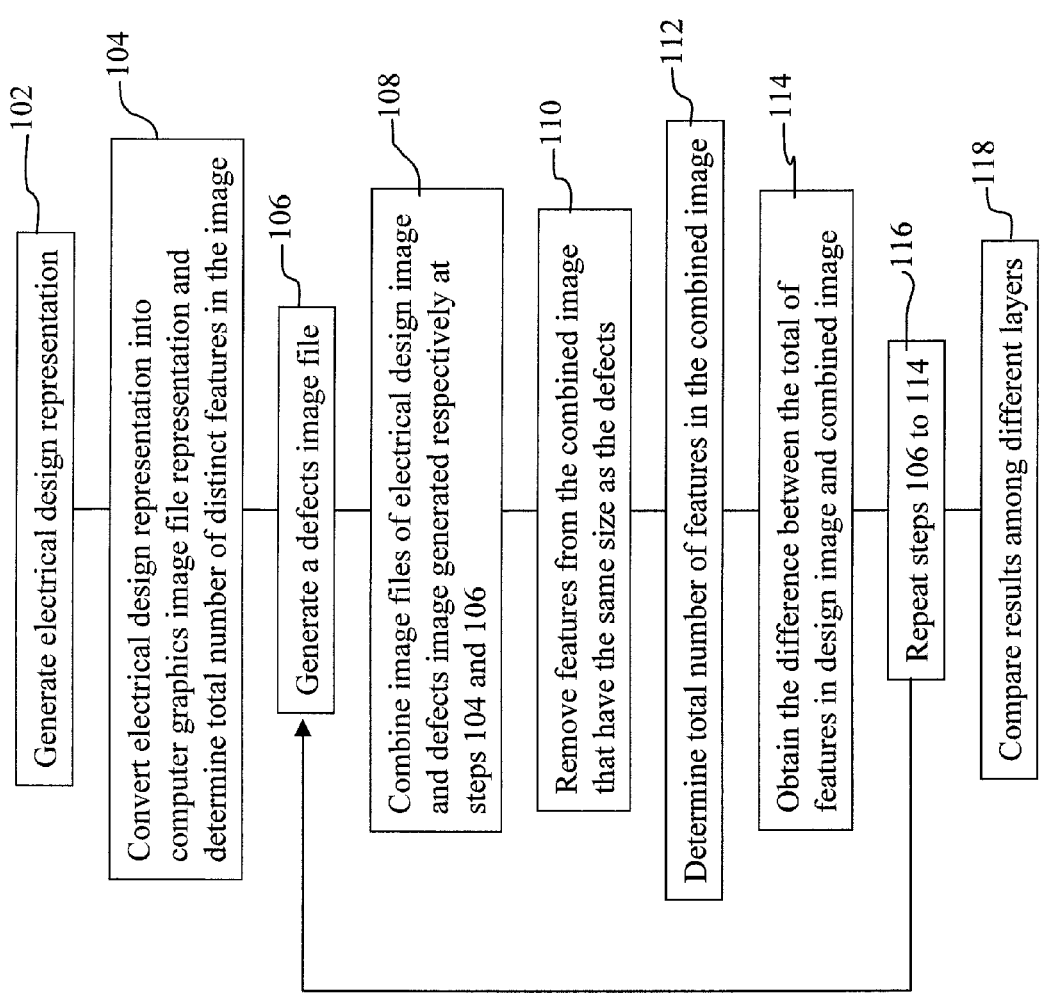
FIG. 1 is a flow diagram illustrating the method of the present disclosure in one embodiment.

FIG. 1 is a flow diagram illustrating the method of the present disclosure in one embodiment. Some of the steps may be implemented in a computer program, for instance, to aid in efficiency while other steps; for instance, steps 102 and 104 may be performed manually or semi-automatically with user interaction. At 102, an electrical package design representation is generated, for example, using computer-aided design/computer-aided manufacture (CAD/CAM) tool or like. An example of such tool includes, but is not limited to AutoCAD, a CAD software application for 2-dimensional (2D) and 3-dimensional (3D) design and drafting. CAD programs typically can run on personal computers, or on graphics terminals connected to mainframe computers or mini-computers. AutoCAD, for example, produces images in a design exchange file (DXF) or like. Briefly, DXF is a CAD data file format, developed by Autodesk and enables data interoperability between AutoCAD and other programs.

The output design file, for example, the DXF may include features that pertain to the physical nature of the design, although dimensions and commentaries need not be included in the design file such as DXF or like. The features of the electrical package or circuit design in an output design file may include, but are not limited to, metal wiring features such as lines or vias. Briefly, vias refer to the through-holes in the printed circuit board (PCB), which connect one layer to another or which act as a thermal path from one layer to another. While the output design file may include labeling or comments, that data can be omitted or deleted from consideration for analysis purposes. An output design file such as the DXF may also include a boundary around the design, for instance. The boundary is the perimeter of the designed part or like that provides a reference to the product's overall area. Including the boundary enables imaging and defect distributions within bounds so that different sized products can be analyzed—and the resulting numbers can be compared to each other. If the same size boundary scale is used, the results may be directly compared to different size products. A boundary may encompass a partial area of the design or an entire design.

At 104, a conversion program is used to extract each design layer from the output design file such as DXF or like and to generate an appropriately dense image file such as graphics interchange format (GIF) file having bitmap image format. A design layer may include a design of substrate, printed circuit board, or chip design, or combinations thereof. Output design file may be converted into any other image format such as JPEG (joint photographic experts group), PNG (portable network graphics), etc. for organizing and storing image data. The size of the image, for instance, X pixels by Y pixels, may be dependant on the general complexity of the design and the size. For example, a larger, more complex design may require a higher degree of resolution than a smaller, simpler one. In one embodiment, each image utilizes white (metal) features on a black background to simulate electrical wiring image. Any other color scheme or graphics attributes may be utilized to distinguish images of the electrical components against a background. An image analysis function is used to count the total number of distinct features in the design. For instance, if the image has white features on a black background to represent the design features, an image analysis function may be used to count the total number of non-contiguous white areas in the image. Any other method or procedure may be used to count the features. The count is used later in the process.

At 106, a "defect image" is generated on an image, for example, having the same size or boundary as the image generated in step 104. Defects, for example, are randomly generated and may be placed as white features. Any automatic random number generation algorithm may be used to generate defects. Additionally or alternatively, defects may be added or generated in the image manually. The size of the "defects" can vary based on the design criteria, and the number of "defects" can be changed to improve sensitivity. In one embodiment, although not necessary, the simulated defects have the same size for one run. However, the sizes of simulated defects may change in the multiple runs from iteration to iteration. For example, all simulated defects for a run have the same size, for instance, of a first value. In next iteration or repetition, all simulated defects in that run may be have another size, for instance, of a second value. This way, it is possible to note the resistance to shorting of the design to a specific defect size, for instance, that could be compared in real situations.

Examples of design criteria that may be considered in determining the size of the simulated defects may include, but are not limited to, minimum line spacing and manufacturing experience. For instance, if one were to use defects that are smaller than the line spacing or element spacing in the design, "virtual shorts" would not occur, as the defects would be too small to make two features touch. On the other end of the scale, the largest defect might be based on experience with the manufacturing facility or processes used to build the product. Experience may indicate that defects are primarily of a certain size.

At 108, the images from steps 104 and 106 are combined into a single image, for instance, using an "OR" image processing function. Any other processing or method may be used to combine the design image and defects image, or place the defects on the design image. The combination of the design image generated in step 104 and the defect image generated in step 106 may result in one or more of the following:

1) some defects that do not touch any design features,
2) some defects that touch only one feature,
3) some defects that touch two or more features.

Figure 2:
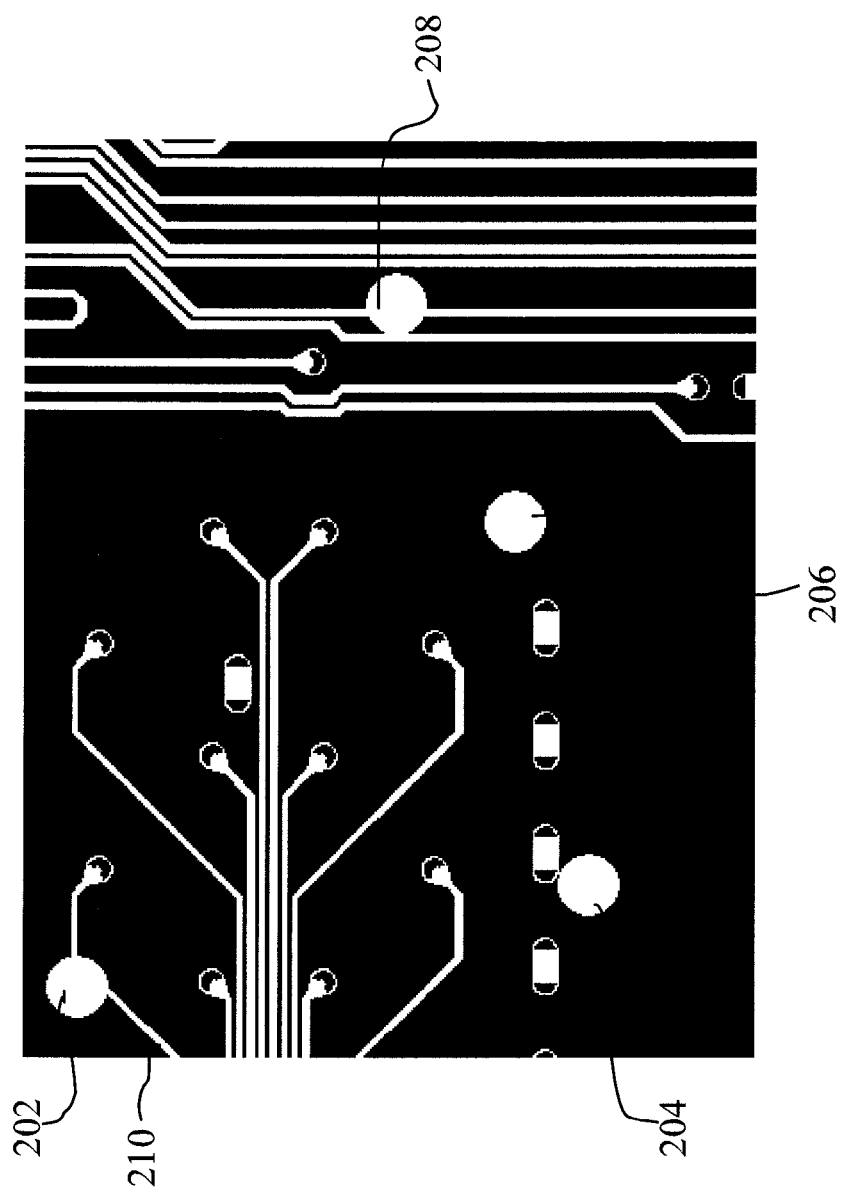
FIG. 2 is an example of composite image combining electrical design features image with defects image.

A sample of this composite image is shown in FIG. 2. The "defects" are represented in the large circles 202, 204, 206, 208. The representation shown in FIG. 2 is not to scale. For example, the size of these defects is good for illustration, but smaller defects may be utilized to provide actual results for design feature of this scale. In this example, only the far right defect 208 resulted in a "short" category that touched two or more features.

Other methods may be employed to overlay randomly generated defects on a design image. For instance, defects may be generated directly on the design image data; and/or location coordinates for simulated defects may be saved or stored, then used to create a design image with simulated defects. Any other image processing may be used to simulate defects on design image.

This technique provides an indication of how much of the design has features that are in close proximity, which provides an indication of the probability that a short will occur between the features. Consider an example of two wiring lines next to one another. While there may be a known method or technique that tells how close the two lines are from each other, the known methodologies would not be able to provide an indication of the probability that a short will occur between the two lines. A static measurement of minimum distance also does not provide a fair assessment of the probability where the lines are of different lengths.

At 110, the features in the image identified as having the size of the "defects" are removed from the image. For instance, a "PRUNE" function or like is used to remove any features that are the size of the "defects". This step eliminates the "virtual" defects that would not end up shorting any elements in the design. For instance, in the above steps, defects on a design were simulated by randomly placing or overlaying defect images over an image representing an electrical design. In this embodiment, only those images that are likely to create a shorting condition are further considered in the analysis. Thus, those defect images standing alone (not touching a design feature) are removed. This pruning eliminates any features from category 1 in step 108, that is, defects that do not touch any design features. Referring to the example shown in FIG. 2, defects shown at 204 and 206 stand alone and are removed from the composite image.

Pruning is a standard technique in image processing where features can be extracted or removed based on their size, for instance, number of pixels. Pruning can be used after the defects are applied to the design image to identify the virtual defects that are still the same size as before being applied to the design image, that is, to identify the defects that did not merge with any design features. Those identified defects are removed so that only those design features with merged defects are counted towards the number of distinct features in the composite image. If there are shorts generated in the process, the number of distinct features will be reduced from the original count of distinct features in the design. The greater reduction of distinct features indicates a greater probability for shorting on that design.

At 112, the total number of features in this composite image is determined. The total number of features in the composite image may be different from the total number of features determined in the design image because some or all of the simulated defects or "virtual defects" have merged two or more design features into a single feature in different areas. An image processing function or like may be used to count the total number of features in the composite image. This may be the similar procedure used in step 104 to determine the total number of features. Defects that touch only one feature does not impact this count since the defect will simply be "absorbed" by the existing feature. The count is impacted by the possibility of the virtual defects touching two or more design features. If the "virtual defect" only touched one design feature, for example, a line, the count is not impacted since it is still counted as only one feature, albeit a bigger feature (unless of course the defect is completely engulfed into the feature). Thus, a defect that touches only one feature is absorbed in the count of that feature. In the example shown in FIG. 3, defect shown at 202 is absorbed in the feature shown at 210 and is counted as part of that feature. The two features shown at 212 and 214 in the design image were counted at step 104 as two distinct features. The defect shown at 208 merges the two features 212 and 214, and the features 212, 214 and the defect 208 are now counted as one distinct feature.

Referring to FIG. 1, at 114, the feature count determined in step 112 is subtracted from the feature count obtained in step 104. If the composite image has only those defects that are absorbed into an existing feature, that is, all defects touch only one feature, then the result of this computation may be zero. Otherwise, the defects that overlap two or more features would merge or connect those two or more features into one distinct countable feature, resulting in a positive number from the subtraction. This count indicates the number of "shorts" that fall in the category of defects that touch two or more features and which were generated as a result of the application of the random defects.

At 116, steps 106 through 114 are repeated multiple times for each layer of the design. The defects may be placed randomly for each repeated run, and thus is likely to be placed at different positions in the design image. The values from the multiple runs may then be used to determine or obtain a mean or average or like value that provides a fairly stable or solid representation of a shorting potential for that layer. The multiple iterations with changes in the position of the defect placements provide an averaging of the technique. Since the technique relies on a random scatter of the virtual defects, repetition of the process would provide a more consistent result on which to base comparisons to other design layers. Repetition of the run may continue until the average number or like among the different runs no longer changes by a predetermined or prescribed percentage, e.g., a minimal number. The number of iterations or runs may be selected as desired, for example, only constrained by programming and/or manufacturing practicalities such as resources and time. Thus, using the data from each run a statistical average or like is obtained from each design layer, that is, the average amount of features that are reduced for all the iterations of that layer.

At 118, this average or like value can be compared to results from other layers, that is, the average value or like from other layers. The comparison represents the means to quantitatively approximate the potential for shorting that considers individual shorting potentials of the designs of other layers.

Figure 3:
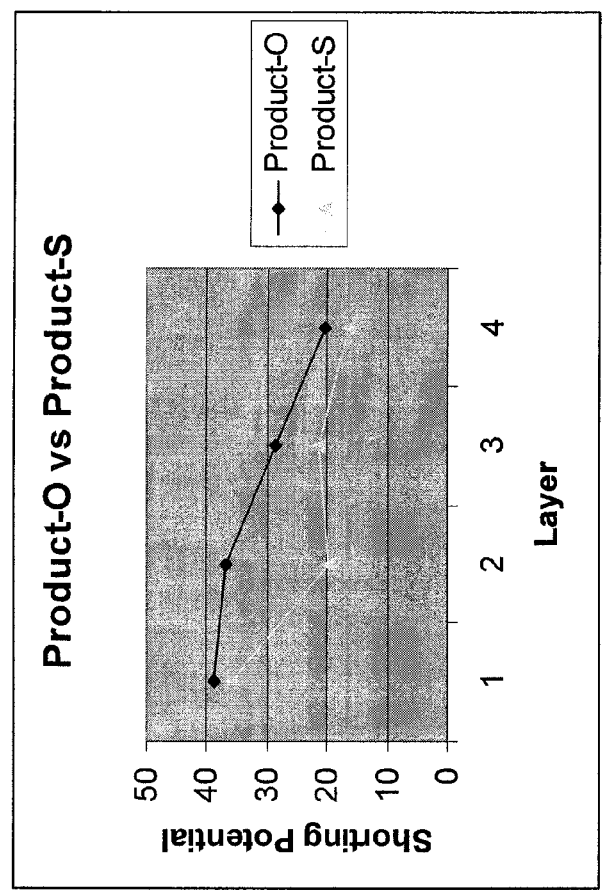
FIG. 3 illustrates an example of results obtained from applying the method of the present disclosure in one embodiment.

FIG. 3 illustrates an example of results obtained from applying the above-described method. Product-O represents the original design. Product-S is a design with engineering change (EC) from an initial design or process, made to improve manufacturability. Product-S is changed based on the shorting probability determined using the method and system of the present disclosure. Examples of changes involved moving wiring and reducing the areas of tighter line spacing. If the process indicates that there may be a higher potential for shorting, lines in the design can be moved so that lines are farther away from each other in some areas. The designer can then perform the method described above on the new design to determine or quantify if the resistance to shorting has improved with the design change. This may be done as part of the design review process that a designer may have with the manufacturing area. The quantitative results of the present disclosure can illustrate whether design changes reduced shorting potential. For instance, FIG. 3 illustrates that the EC reduces shorting potential on each layer.

If the method described in the present disclosure is applied to designs being manufactured, eventually there will be a baseline design established. For example, based on experience, it can be observed that layers with a higher shorting potential as measured by the method and system of the present disclosure are found to be more difficult or laborious to manufacture (lower yields, longer cycle time, more reworks, etc). The baseline, for example, can be the value above which designs would be considered "hard to manufacture". Design layers that are more difficult to manufacture may have higher shorting potential as measured by the method and system of the present disclosure. Once that level or baseline is known, new designs can be evaluated against this baseline design. The method and system of the present disclosure can quantitatively indicate whether a design is too difficult to manufacture. For example, a high shorting potential would indicate difficulty or lack of feasibility in manufacturing. Once this indication is known, the design can be re-evaluated or re-designed or appropriate provisions can be made in the manufacturing process in accordance with the expectation that this layer of the design will be difficult to manufacture. Examples of appropriate provisions may include but are not limited to adding inspections or using more advanced tooling.

Figure 4:
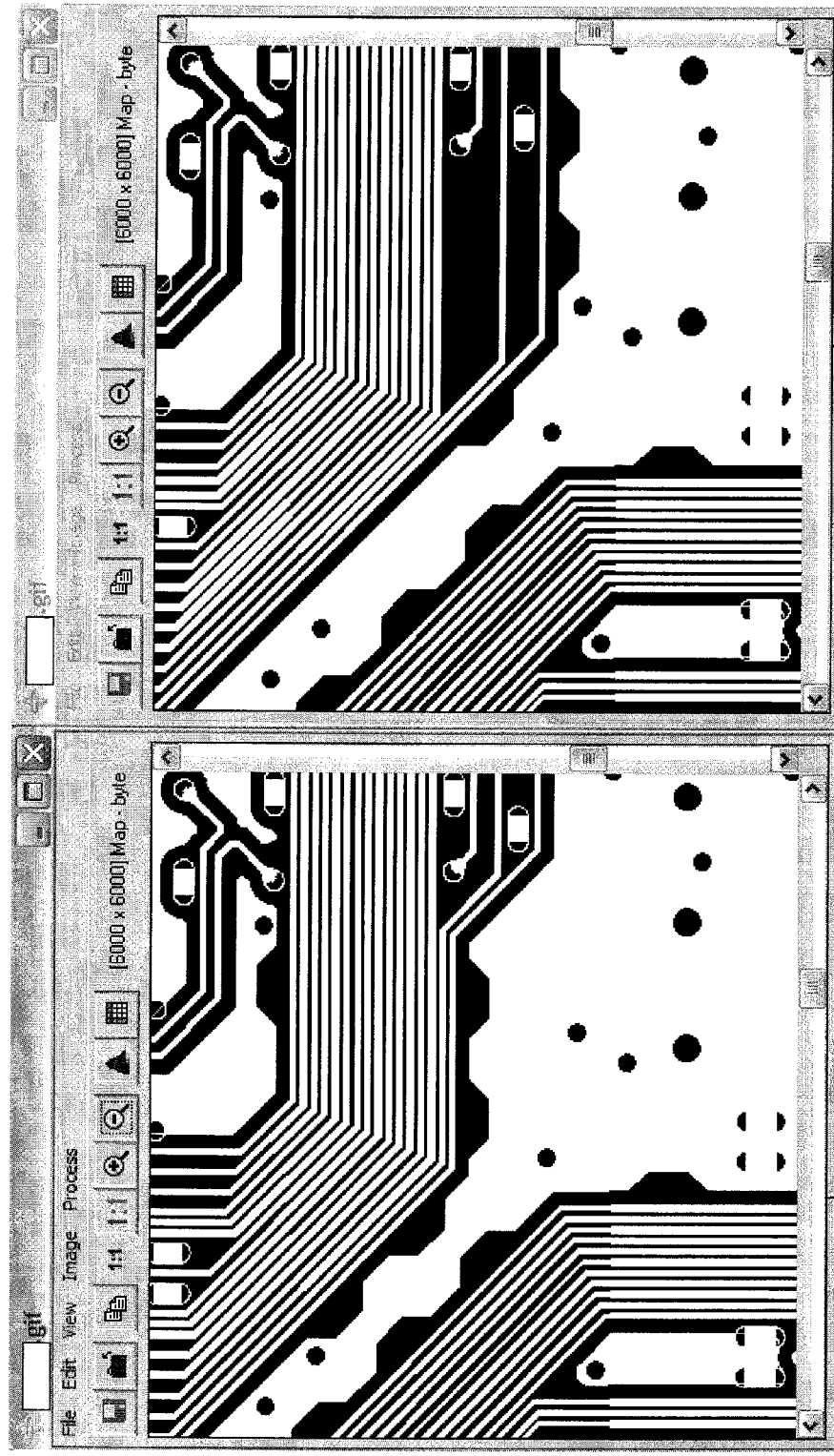
FIG. 4 illustrates an example of the type of changes reflected in the chart of FIG. 3.

FIG. 4 illustrates an example of design changes. A layer from Product-S is shown at 402. The same layer for Product-O is shown at 404. Notice the subtle changes in the proximity of the shielding metal in this representative region. Using the method of the present disclosure, shorting potential for the original design and changed design can be quantified and evaluated, for example, as shown at FIG. 3. The method and system of the present disclosure thus quantifies or assigns a quantitative number or representation to subjective changes that were by the designer.

The method shown above can quantify a design's shorting potential and thus represent subjective changes that were by the designer using quantitative number that can be used in analysis and evaluation. Wiring layers within a single product can be compared to each other as well as to other wiring in different products.

The method and system of the present disclosure provides the ability to improve the design for manufacturing in a quantitative way. This is more desirable than just designing for electrical functionality and then leaving it up to the manufacturing business unit to figure out the manufacturability. It also provides a means for manufacturing to evaluate the complexity of a layer's design and apply the appropriate level of tooling to the process. Often, manufacturing firms have different levels of tooling with varying ranges of process capabilities. All of these are usually constrained by capacity or costs in some fashion. The ability to quantify the difficulty of a particular design will enable the application of the appropriate tooling to maximize costs and throughput at higher yields.

The method of the present disclosure may be embodied as a computer program or software or like, for instance, with a user interface, for allowing a user to interact with the software. For example, a processing system for performing the above methods may include functional or logical processing modules such as a defects image generator module that executes on a processor and generates defects image data and combines the defects image data randomly with image data representing electrical wiring design to simulate a plurality of defects associated with the electrical wiring design. An image analysis module may run on a processor and determine the difference in the number of distinct features in the image data representing electrical wiring design and the combined defects image data and the image data. The difference represents quantification of shorting potential for the electrical wiring design whose image is being analyzed. Additional functional or logical modules may be implemented to perform various analysis of the image to quantify the shorting potential in the design. A person of ordinary skill in the art will understand that the modules need not be divided only as described above, but that the functions can also be performed by one or many processing units or programs.

The software or like may be implemented to interoperate with a CAD/CAM software such that the conversion into an image data file can be processed automatically from the CAD/CAM design of the electrical design.

The system and method of the present disclosure may be implemented and run on a general-purpose computer or computer system. The computer system may be any type of known or will be known systems and may typically include a processor, memory device, a storage device, input/output devices, internal buses, and/or a communications interface for communicating with other computer systems in conjunction with communication hardware and software, etc.

The terms "computer system" and "computer network" as may be used in the present application may include a variety of combinations of fixed and/or portable computer hardware, software, peripherals, and storage devices. The computer system may include a plurality of individual components that are networked or otherwise linked to perform collaboratively, or may include one or more stand-alone components. The hardware and software components of the computer system of the present application may include and may be included within fixed and portable devices such as desktop, laptop, server. A module may be a component of a device, software, program, or system that implements some "functionality", which can be embodied as software, hardware, firmware, electronic circuitry, or etc.

The embodiments described above are illustrative examples and it should not be construed that the present invention is limited to these particular embodiments. Thus, various changes and modifications may be effected by one skilled in the art without departing from the spirit or scope of the invention as defined in the appended claims.

We claim:

1. A system for quantifying manufacturing complexity of electrical designs, comprising:
    a defects image generator module operable to run on a processor and to generate defects image data and combine the defects image data randomly with image data representing electrical wiring design to simulate a plurality of defects associated with the electrical wiring design; and
    an image analysis module operable to run on a processor and to determine a difference in the number of distinct features in the image data representing electrical wiring design and the combined defects image data and the image data, said difference representing quantification of shorting potential for said electrical wiring design,
    wherein the image data representing electrical wiring design comprises a plurality of electrical components,
    wherein the defects image data that do not touch one or more of the plurality of electrical components in the combined defects image data and the image data is removed from the combined defects image data and the image data,
    wherein the difference in the number of distinct features comprises a difference in a total number of the plurality of electrical components that are not touching in the image data and a total number of the plurality of electrical components that are not touching in the combined defects image data and the image data,
    wherein two or more of the plurality of electrical components in the combined defects image data and the image data, connected by a defect image are considered as touching and counted as one distinct feature.

2. The system of claim 1, further including:
    a processing module operable to execute said defects image generator module and said image analysis module repeatedly until one or more predetermined criteria is met, the processing module further operable to determine a statistical average of a plurality of differences obtained from running said defects image generator module and said image analysis module repeatedly.

3. A method of quantifying manufacturing complexity of electrical designs, comprising:
    randomly, by at least one processor, generating a plurality of defect images on image data representing an electrical wiring design to form a composite image data; and
    determining by the at least one processor, difference in the number of distinct features in the image data and the composite image data, said difference indicative of shorting potential in said electrical wiring design, wherein the image data representing an electrical wiring design comprises a plurality of electrical components, wherein a defect image of the plurality of defect images that does not touch one or more of the plurality of electrical components in the composite image data is removed from the composite image data, wherein the difference in the number of distinct features comprises a difference in a total number of the plurality of electrical components that are not touching in the image data and a total number of the plurality of electrical components that are not touching in the composite image data, wherein two or more of the plurality of electrical components in the composite image data connected by a defect image of the plurality of defect images are considered as touching and counted as one distinct feature.

4. The method of claim 3, further including:

repeating the steps of generating and determining until one or more predetermined criteria is met; and determining a representative shorting potential in said electrical wiring design based on a plurality of shorting potentials obtained from repeating the steps.

* * * * *